United States Patent [19]

Brar et al.

[11] Patent Number: 5,017,439
[45] Date of Patent: May 21, 1991

[54] MICRO-CONTAMINATION-FREE COATING FOR DIE-CAST COMPONENT IN MAGNETIC DISK DRIVE

[75] Inventors: Amarjit S. Brar, Edina; Prativadi B. Narayan, Eden Prairie, both of Minn.

[73] Assignee: Seagate Technology, Inc., Scotts Valley, Calif.

[21] Appl. No.: 382,098

[22] Filed: Jul. 19, 1989

[51] Int. Cl.$^5$ .................. C23C 14/02; C23C 22/24
[52] U.S. Cl. .................. 428/629; 148/264; 204/192.31; 427/38; 428/632; 428/938
[58] Field of Search ............... 204/29, 192.31; 427/38, 427/39; 148/264; 428/621, 628, 649, 654, 629, 632, 938

[56] References Cited

U.S. PATENT DOCUMENTS

| | | | |
|---|---|---|---|
| 3,099,609 | 7/1963 | Katayose | 204/33 |
| 3,883,114 | 5/1975 | Harris et al. | 251/366 |
| 3,969,195 | 7/1976 | Dötzer et al. | 204/58.5 |
| 4,652,954 | 3/1987 | Church | 360/120 |
| 4,756,810 | 7/1988 | Lamont, Jr. et al. | 204/192.3 |

OTHER PUBLICATIONS

F. A. Lowenheim, Electroplating, McGraw-Hill Book Co., New York, 1978, pp. 93–98, 442–449.
B. Chapman, Glow Discharge Processes, John Wiley & Sons, New York, 1980, pp. 276–277.
D. M. Mattox, Fundamentals of Ion Plating, J. Vac. Sci. Technol., vol. 10, No. 1, Jan/Feb. 1973, pp. 47–52.
R. Carpenter, Ion Plating: How to Make Films Stick, Compon. Technol. (GB), vol. 4, No. 6, Feb. 1971, pp. 17–22.

Primary Examiner—John F. Niebling
Assistant Examiner—William T. Leader
Attorney, Agent, or Firm—Kinney & Lange

[57] ABSTRACT

A process for treating the surface of a die-cast article including the steps of chemically cleaning the surface, cleaning the surface with an argon plasma, depositing an ion vapor generated metallic coating, mechanically treating the deposited coating, and chromate converting the mechanically treated coating. Preferably, the die-cast metal article consists essentially of an aluminum or magnesium alloy while the metallic coating is aluminum. The mechanical treatment may be carried out by bead blasting, tumbling or barreling and may be followed by walnut shell polishing.

8 Claims, No Drawings

MICRO-CONTAMINATION-FREE COATING FOR DIE-CAST COMPONENT IN MAGNETIC DISK DRIVE

BACKGROUND OF THE INVENTION

1. Field of the Invention

The present invention relates to a surface treatment of an article and in particular to surface treatment of a metallic article to prevent generation of microcontamination by the article.

2. Description of the Prior Art

Close tolerance, precision equipment is vulnerable to dust and other microcontaminants. In a hard disk drive, for example, the flying head may be separated from the surface of the spinning disc of recording media by a distance as small as about 0.25 micrometers. A particle of dust interrupting the small separation space can cause a "head crash" and result in damage to both equipment and magnetically recorded data. Therefore, durable, dependable close tolerance, precision equipment requires internal components which do not generate microcontaminants.

Typically, critical metallic components for such precision equipment have been machined from wrought aluminum or magnesium then surface finished by passivation. A less expensive method of providing dimension-critical metallic components is die-casting. Die-cast components, however, have microporous surfaces and tend to carry traces of lubricants, oils and mold release chemicals in the micropores and on the surface. These chemicals also interfere with the passivation process, and result in passivation layers which are subject to peeling. Peeling of the passivation layer, in turn, exposes the revealed metal to corrosion. Peeling passivation layers and corroding metal are both sources of microcontaminants which are detrimental to durability and dependability in precision equipment such as disc drives.

Peeling also exposes additional surface microposres, thereby freeing any contaminants trapped therein. If the component outgases (i.e. releases vapors from hydrocarbon fluids carried in the surface or in micropores), then a film-like coating of hydrocarbon contaminants can deposit upon the head and disk. The hydrocarbon contaminant coating adversely affects the tribological properties of the hard disk drive increasing stiction and wear. In hard disk drives, many components made of aluminum and magnesium alloy systems are used. Many of these critical components are machined from wrought aluminum alloys such as 6061-T6 and 7075-T6. Alternatively, some components are made from sheet metal aluminum alloys such as 5052 and 5086 and die-cast aluminum alloys such as 360 and 380. Other components, such as the head arm carriage are made of magnesium die-cast AZ-91C alloy. There are also components made of sand-cast, investment-cast and powder-metallurgy alloys.

Die-cast components could be more widely used in precision equipment if the problem of microcontamination could be solved.

The prior art includes surface treatment processes which are not specifically aimed at preventing microcontamination. For example, Lamont U.S. Pat. No. 4,756,810 discloses depositing an aluminum alloy onto a substrate (such as a semiconductor wafer), followed by redistributing the deposit by bombarding with ions. Church U.S. Pat. No. 4,652,954 discloses depositing, by vacuum evaporation or sputtering, a thin film of NiFe upon a ceramic substrate. After electroplating additional metal upon the film, another over layer of aluminum oxide is sputter deposited. Katayose U.S. Pat. No. 3,099,609 discloses a process of removing the oxidized surface film from aluminum alloy material; cleaning the surface with a mixed solution of HCl and HF; anodizing with a solution of chromic acid, sulfuric acid or phosphoric acid; and electroplating chromium onto the surface.

SUMMARY OF THE INVENTION

The present invention includes a surface treatment process which allows an economical and dependable replacement of a machined wrought aluminum article by a die-cast aluminum alloy casting. The surface treatment of the present invention decreases or prevents particulate and film-like microcontamination from a die-cast metallic article during the useful life of the article. The surface treatment process of the present invention includes the steps of chemically cleaning the surface; plasma cleaning the surface; depositing an ion vapor generated aluminum coat upon the plasma cleaned article; bead blasting the deposited aluminum coat; walnut shell blasting the bead blasted coat; and depositing a chromate conversion coating upon the walnut cleaned coat. The present invention further includes an article treated by the inventive process.

DETAILED DESCRIPTION OF THE PREFERRED EMBODIMENTS

Machined wrought alloy surfaces typically have been cleaned by conventional techniques such as detergent cleaning and solvent cleaning. The surface of a typical die-cast article, however, includes mold release chemicals and other types of contamination which are very difficult to remove by such conventional cleaning techniques. Also, the surface of a die-cast article is usually rougher than the machined surface. As a result of these two factors, a chromate conversion coating does not acceptably adhere to a die-cast surface cleaned by conventional techniques and tends to peel off of the surface. The surface then loses its passivation and corrosion inhibition properties and serves as a source of unacceptable particulate and film-like microcontamination.

The surface treatment of the present invention involves cleaning the surface, depositing aluminum, mechanical treatment of the deposited aluminum, mechanical polishing, and chromate conversion coating. These steps are described in detail below. Subsequently, the properties of an article subjected to the surface treatment process are described.

CLEANING THE SURFACE

In the first step of a surface treatment process in accordance with the present invention, mold release chemicals and other contaminants of the surface are removed. By "mold release chemicals" is meant any residual chemicals, including partially decomposed chemicals, which originated on the mold or die-surface, and were present for the purpose of facilitating removal of the casting from the mold or die at the conclusion of the die-casting process. Cleaning of the surface to remove mold release chemicals includes the three substeps: alkaline treatment, organic extraction, and plasma cleaning. The substeps of alkaline treatment and organic extraction chemically clean the surface of the die-cast article. These substeps are described as follows:

1. Alkaline Treatment

Many of the contaminants adhere strongly to the aluminum oxide layer. A solution of 5-10% sodium hydroxide (NaOH) in deionized water is employed as a pre-cleaning etchant for the die-cast aluminum surface. The NaOH dissolves away aluminum oxide, and with it, much of the mold release chemicals and other contaminants.

2. Organic Extraction of the Surface

The die-cast article is next cleaned in a volatile solvent system. Preferably, an inert solvent, for example, a chlorofluorocarbon such as trifluorotrichloroethane (Freon T.F.) or similar volatile inert organic solvent is included in the solvent system. Most preferably, the solvent system consists of a 95% Freon T.F. and 5% isopropyl alcohol mixture. Preferably, the organic solvent cleaning substep is performed with an ultrasonic cleaner. The organic solvent cleaning serves to remove most of the oils, film-like organic residues, and other hydrocarbons, such as mold release compounds contaminating the surface. This substep also removes loose particles residing upon the surface.

3. Argon Plasma Cleaning

The article is next placed in an ion vapor deposition (IVD) vacuum chamber and subjected for about ten minutes to an argon plasma which removes any strongly adherent hydrocarbons which were not removed by the alkaline treatment or the volatile organic solvent. The atmosphere of the vacuum chamber is preferably about an 80% nitrogen and about 20% argon mixture (on a volume/volume basis) during the argon plasma cleaning cycle. Oxygen is especially excluded from the atmosphere of the chamber because any amount of oxygen will oxidize the surface forming an aluminum oxide barrier upon the article surface. The plasma cleaning removes any monolayer-type hydrocarbon contamination and any oxide layers. Since argon has higher atomic weight than nitrogen, an addition of about 20% (volume/volume) argon significantly improves the contamination removal rate.

ALUMINUM DEPOSITION

Following the argon plasma cleaning treatment, the surface is ready for an IVD aluminum coating. The article is not removed from the chamber in order to avoid exposure to oxidizing conditions. An aluminum wire is heated in an electric furnace, within the vacuum chamber, on a continuous basis, thereby generating aluminum vapor around the article in the chamber. The aluminum vapor is R.F. plasma-enhanced and deposited onto the surface of the die-cast article.

The IVD process deposits energized aluminum atoms onto the surface. Since the aluminum atoms and ions impinge on the surface of the article with high kinetic energy, the resulting aluminum layer is bonded to the substrate surface and provides excellent adhesion and uniform coverage. The thickness of the layer can be reliably controlled by modifying the deposition parameters. Particularly useful in controlling the thickness is the rate at which the aluminum wire is fed into the electric melting furnace. Preferably, the deposited aluminum layer is about one mil thick and consists of aluminum of at least 99.9% purity. If the aluminum wire includes other constituents, the protective layer will not be tenacious at locations where the other constituent is deposited upon the surface.

MECHANICAL TREATMENT OF THE DEPOSITED ALUMINUM LAYER

The IVD deposited aluminum layer on the casting is next bead-blasted with glass beads at moderate energies. The bead-blasting serves to decrease the porosity of the deposited aluminum coating, increase the density, prepare a smooth surface and further increase the adhesion of the deposited aluminum layer to the die-cast substrate. A pore-free, dense and smooth surface tends to generate fewer microcontaminant particles than a rough and porous surface.

POLISHING OF MECHANICALLY TREATED ALUMINUM LAYER

Next, the bead blasted surface is blasted with walnutshells to mechanically clean the mechanically treated deposited aluminum coating. The walnut shell blasting serves to remove any stuck bead pieces (i.e. pieces of silica) from the surface and tends to make the surface more homogeneous and smooth.

CHROMATE CONVERSION COATING

A clear chromate conversion coating is deposited on the deposited aluminum layer. This chromate coating improves the corrosion resistance of the article. Because the surface is a substantially pure aluminum surface strongly adhering to the underlying die-cast aluminum substrate, the chromate coating adheres more tightly than on a typical die-cast aluminum surface.

PROPERTIES OF THE FINISHED PRODUCT

Turbidity is a sensitive measure of the tendency to generate microcontaminant particles. Turbidity data for a die-cast aluminum spacer ring (for use in a disk drive) treated by the process of this invention shows results at least equivalent to a machined wrought aluminum spacer ring with a chromate conversion coating. That is, the turbidity observed for a die-cast aluminum spacer ring treated as described above was equal to or lower than the turbidity of a machined wrought aluminum spacer ring with a conventional surface treatment. By comparison, a die-cast aluminum spacer ring treated by the method typically used for machined wrought aluminum was found to be unacceptable based upon higher turbidity measurements (about 10 times higher) than the machined wrought aluminum spacer ring. Typically, machined wrought aluminum spacer rings which had been passivated, and die-cast spacer rings treated according to the process of this invention showed turbidity readings of about 2.0 NTU; whereas die-cast spacer rings passivated as machined wrought spacer rings showed readings of about 20 NTU.

The surface treatment process of the present invention is believed applicable not only to die-cast aluminum alloy articles but also to sand-cast, investment-cast and powder metallurgy articles. Its use is not limited to aluminum die-cast alloys but may also be employed with die-cast magnesium and other alloys. The process can also be employed on wrought aluminum articles, with or without machining, as well as other metallic alloy substrates which require passivation and corrosion protection. For metallic substrates, the adhesion of the pure IVD aluminum layer is excellent and very effectively seals up the surface to prevent outgassing from micropores. Since the process is a dry technique without the involvement of either acidic or alkaline aqueous solutions, problems of liquid entrapment on the surface or in micropores are avoided.

Although the present invention has been described with reference to preferred embodiments, workers skilled in the art will recognize that changes may be made in form and detail without departing from the spirit and scope of the invention.

What is claimed is:

1. A process for treating the surface of a die-cast metal article which consists essentially of aluminum alloy or magnesium alloy, comprising:
   chemically cleaning the surface;
   cleaning the surface with an argon plasma;
   depositing an ion vapor generated aluminum coating upon the cleaned surface;
   mechanically treating the deposited aluminum coating; and
   chromate converting the mechanically treated coating.

2. The process of claim 1 wherein the deposition step includes R.F. plasma enhanced vapor deposition.

3. The process of claim 1 wherein the mechanical treatment step includes bead blasting.

4. The process of claim 1 wherein the mechanical treatment step includes tumbling or barreling.

5. The process of claim 1 and further comprising the step:
   mechanically cleaning the mechanically treated deposited coating.

6. The process of claim 5 wherein the mechanically cleaning step includes:
   walnut shell polishing the mechanically treated surface prior to chromate converting.

7. The process of claim 1 wherein the cleaned surface is not exposed to oxidizing conditions prior to the metallic deposition step.

8. An article prepared by the process of claim 1.

* * * * *